US008824111B2

(12) United States Patent
Pugsley et al.

(10) Patent No.: US 8,824,111 B2
(45) Date of Patent: Sep. 2, 2014

(54) ELECTROSTATIC DISCHARGE PROTECTION

(75) Inventors: William Pugsley, Cambridge (GB); Justin Penfold, Suffolk (GB); Ian Sabberton, Cambridge (GB)

(73) Assignee: Cambridge Silicon Radio Limited, Cambridge (GB)

(*) Notice: Subject to any disclaimer, the term of this patent is extended or adjusted under 35 U.S.C. 154(b) by 806 days.

(21) Appl. No.: 13/124,648

(22) PCT Filed: Sep. 28, 2009

(86) PCT No.: PCT/EP2009/062513
§ 371 (c)(1),
(2), (4) Date: May 15, 2012

(87) PCT Pub. No.: WO2010/043485
PCT Pub. Date: Apr. 22, 2010

(65) Prior Publication Data
US 2012/0281322 A1    Nov. 8, 2012

(30) Foreign Application Priority Data

Oct. 17, 2008  (GB) .................................. 0819084.5

(51) Int. Cl.
*H02H 9/00*     (2006.01)
*H03K 19/003*   (2006.01)
*H01L 27/02*    (2006.01)

(52) U.S. Cl.
CPC ...... *H03K 19/00315* (2013.01); *H01L 27/0285* (2013.01)
USPC .......................................................... 361/56

(58) Field of Classification Search
USPC .......................................................... 361/56
See application file for complete search history.

(56) References Cited

U.S. PATENT DOCUMENTS 5,311,391 A * 5/1994 Dungan et al. ................. 361/56
5,910,874 A   6/1999 Iniewski et al.
(Continued)

FOREIGN PATENT DOCUMENTS

| CN | 101019292 A  | 8/2007 |
| WO | 02/075891 A1 | 9/2002 |
| WO | 02/175891 A1 | 9/2002 |

OTHER PUBLICATIONS

Chinese Search Report dated Sep. 19, 2012, in corresponding Chinese patent application.

(Continued)

*Primary Examiner* — Stephen W Jackson
(74) *Attorney, Agent, or Firm* — Vorys, Sater, Seymour and Pease LLP; Vincent M DeLuca

(57) ABSTRACT

A circuit for protecting a node (201) in an electronic device (200) from an electrostatic discharge comprising: a voltage rail (206) arranged to provide an predetermined voltage when the device is powered; a first switching device (202) connected between said node (201) and ground (204); a second switching device (203) coupled to said node (201) and arranged to control the conductance of the first switching device (202) between said node (201) and ground (204); wherein, the second switching device (203) is configured to, irrespective of whether the device is powered or not powered, (a) hold the conductance of the first switching device (202) low when the potential difference between the node (201) and the voltage rail (206) is within an operating range, and (b) hold the conductance of the first switching device (202) high in response to an overvoltage at the node (201) so as to allow current to flow from the node (201) to ground (204).

15 Claims, 3 Drawing Sheets

(56) References Cited

U.S. PATENT DOCUMENTS

| | | |
|---|---|---|
| 5,917,689 A | 6/1999 | English et al. |
| 5,982,217 A | 11/1999 | Chen et al. |
| 6,628,493 B1 | 9/2003 | Chen et al. |
| 6,898,062 B2 | 5/2005 | Russ et al. |
| 6,919,602 B2 | 7/2005 | Lin et al. |
| 7,106,562 B2 | 9/2006 | Kitagawa |
| 7,233,468 B2 * | 6/2007 | Chang et al. ............ 361/56 |
| 8,284,530 B1 * | 10/2012 | Vashchenko et al. ......... 361/56 |
| 2003/0043517 A1 | 3/2003 | Tsuji et al. |
| 2003/0201457 A1 | 10/2003 | Lin et al. |
| 2003/0214773 A1 | 11/2003 | Kitagawa |

OTHER PUBLICATIONS

Chinese Office Action dated Oct. 8, 2012 and comments, in corresponding Chinese patent application.

* cited by examiner

ELECTROSTATIC DISCHARGE PROTECTION

BACKGROUND OF THE INVENTION

This invention relates to a circuit for protecting a device or electronic components from an electrostatic static discharge or other source of potentially damaging overvoltage.

Various circuit designs are currently used to protect sensitive components from an electrostatic discharge (ESD). Such circuits are commonly called "ESD clamps" because they act to clamp the sensitive node of a component to ground or other safe voltage when an ESD event occurs. However, each of the conventional ESD clamp designs suffers from one or more problems. Some of the conventional ESD clamp designs and their drawbacks will now be described with reference to FIG. 1, which illustrates three different conventional ESD clamping techniques.

FIG. 1a shows a common type of ESD clamp configured to protect point 101 in the circuit shown. Typically, point 101 is the power rail of an integrated circuit. When a DC voltage is applied to the power rail the ESD clamp is disabled. If power rail 101 is at 0V DC and a signal having a fast rise time (such as an ESD event) is applied to power rail 101, the circuit will clamp the power rail to ground rail 102. Therefore this type of clamp only works when the circuit is not powered.

Point 108 in the circuit is coupled to ground by capacitor 107 and is connected to point 101 by resistor 106 (an RC filter arrangement). When an ESD event occurs at point 101, the voltage at that point increases rapidly. Node 108 does not respond to the ESD event and the input of the inverting amplifier comprising transistors 104 and 105 appears low and its output is driven high. This ensures that the large transistor 103 (typically called the "BIGFET" when it is a large MOSFET) is on to short the charge to ground 102.

In contrast, during normal operation when a DC voltage is applied to the power rail BIGFET 103 is off. BIGFET 103 is turned off because under DC conditions the voltage at point 108 will be the same as the voltage at point 101, causing the input of the inverting amplifier (104 and 105) to be high and therefore the output of the inverting amplifier to be low. The clamp reliably operates only when the initial voltage at 101 is zero and a fast voltage ramp is applied at 101. The protection provided by the clamp of FIG. 1a is therefore disabled during normal operation of the device or components which the clamp is configured to protect.

Furthermore, due to its high capacitance and the possibility of the clamp partially turning on as a result of the fluctuating voltage, the clamp may degrade an AC signal carried at point 101. This kind of clamp is therefore only suitable for protecting those points on a circuit that carry DC or low frequency signals, such as power supply rails. The clamp is unsuitable to protect the pins of an integrated circuit that carry high frequency AC signals, such as the output pins of a radio frequency chip. Finally, the clamp requires a large silicon area in order to accommodate the RC filter (components 106 and 107 of FIG. 1a).

FIG. 1b shows an ESD clamp which uses diodes 112 and 113 configured to shunt an ESD event which occurs at point 101 onto power supply rail 110 or ground 102, depending on its polarity. Point 101 is shown as an input/output port of circuit 114 but could be any point in a circuit requiring protection from ESD events. This type of clamp also requires an ESD clamp of any suitable type across the power supply to conduct positive ESD pulses that are applied between point 101 and ground, and to conduct negative pulses that are applied between point 101 and supply rail 110. In FIG. 1b a BIGFET clamp is shown across the power supply.

An ESD clamp of the type illustrated in FIG. 1b is typically used for protecting a terminal to which AC signals are applied. During normal operation the power rail is held high so a voltage waveform whose voltage does not exceed the rail voltage can be applied to 101 without forward biasing the diodes. No current will flow in the diodes, so there will be no disruption to circuit performance. During an ESD event, current will flow through the diode onto the power rails. The power rails are clamped by a power supply clamp, such as a BIGFET clamp shown in FIG. 1a.

The ESD protection circuit illustrated in FIG. 1b can not tolerate voltages at point 101 that significantly exceed the supply rail voltage without conducting current through the diodes. If this occurs, the impedance at point 101 is affected and the circuit operation will degrade.

FIG. 1c shows a Grounded Gate NMOS (ggNMOS) 109, which may be used as an ESD clamp between point 101 and ground (GRD) 102. This type of ESD clamp is operational when point 101 is both powered and when it is not powered (i.e. the circuit to be protected is on or off) and is typically used to protect either chip terminals or power rails. A ggNMOS is able to protect nodes that carry AC signals since its triggering mechanism is immune to all but the highest frequency AC signals. However, a ggNMOS does present significant capacitive load for RF signals. The ggNMOS makes use of the parasitic components that are created due to the way that MOS devices are fabricated on CMOS integrated circuits. In practice the ggNMOS can be an NMOS or a PMOS device.

However, a ggNMOS is unsuitable for use in the latest deep sub-micron processes due to the high trigger voltages and hold voltages of the clamp. ggNMOS devices therefore offer limited protection in modern integrated circuits.

The clamp types described above are useful for protecting circuits within chips when they have not yet been soldered down on to a PCB to create a final product such as a mobile phone. Once the chip has been incorporated with other components in to a final product, the final product must be able to tolerate ESD events regardless of whether it is powered or not and the amount of ESD that the circuit must be able to tolerate is significantly higher than the ESD tolerance of a typical chip.

There are three techniques currently used to provide protection to in-situ circuits against system-level ESD events.
(i) Mechanical.

Sensitive nodes in the circuit may be physically isolated from the ESD by housing parts, barriers, plastic packaging etc. However, this is not useful for connections that must be available to the outside world, such as connectors and antennas.
(ii) External Clamps.

Sensitive nodes in a circuit can be electrically isolated/ protected using discrete components external to the circuit. However, this is not useful if the circuit will not tolerate external the parasitic load of these external components, such as RF antennas. Furthermore, the use of such components is expensive, in terms of cost, production effort and PCB area.
(iii) Internal Clamps.

Sensitive nodes can be protected to some extent by a circuit shown in FIG. 1b. However, since the BIGFET clamp between the power rails is not effective when the device is powered, the rails must be clamped using other techniques.

The above techniques can provide varying forms of ESD protection, depending on the type of circuit which is to be protected and the circuit technologies involved. However, these techniques do not work very well, especially with high frequency chips fabricated using the latest technologies. As a result, expert PCB and package design has become a critical part of ESD protection.

There are problems with all of the clamp designs currently employed to handle ESD events in an electronic device. There is therefore a need for an improved circuit for protecting an electronic device (such as an integrated circuit) sensitive to ESD events. In particular, there is a need for a circuit capable of protecting an electronic device when that device is both powered and not powered, and additionally capable of protecting points in a device carrying high frequency signals.

SUMMARY OF THE INVENTION

According to a first aspect of the present invention there is provided a circuit for protecting a node in an electronic device from an electrostatic discharge comprising: a voltage rail arranged to provide a predetermined voltage when the device is powered; a first switching device connected between said node and ground; a second switching device coupled to said node and arranged to control the conductance of the first switching device between said node and ground; wherein, the second switching device is configured to, irrespective of whether the device is powered or not powered, (a) hold the conductance of the first switching device low when the potential difference between the node and the voltage rail is within an operating range, and (b) hold the conductance of the first switching device high in response to an overvoltage at the node so as to allow current to flow from the node to ground.

Suitably the first and second switching devices are transistors of opposite polarity. Preferably the drain or collector of the second switching device is coupled to ground by means of a resistor so as to reduce the gate or base voltage of the first device therefore reducing the leakage current through the first switching device.

Preferably the gate or base of the second switching device is coupled to the voltage rail. Preferably the second switching device is connected between the node and the gate or base of the first switching device.

Preferably the second switching device is coupled to the node by means of a diode in such a way as to increase the voltage level at the node which causes the second switching device to switch. Preferably the base or gate of the second switching device is coupled to the diode by a resistor so as to reduce the sensitivity of the second switching device to voltage fluctuations at the node.

The circuit may further comprise a third switching device coupled to ground and configured to, when the device is powered, hold the conductance of the first switching device low when the potential difference between the node and the voltage rail is within the operating range, and, when the device is not powered, hold the conductance of the first switching device high in response to an overvoltage at the node.

Preferably the second and third switching devices are transistors of opposite polarity. Preferably the third switching device is connected between the base or gate of the first switching device and ground.

The circuit may further comprise: a fourth switching device and a resistor connected in series between the node and ground so as to form a potential divider; a voltage inverter receiving as its input the output of the potential divider and providing its output at the base or gate of the third switching device; wherein the fourth switching device is a transistor having its base or gate connected to the voltage rail.

Preferably the operating range is approximately equal to the threshold voltage of the second switching device.

Suitably the operating range is at least partly determined by said diode.

Preferably the node is at an overvoltage when the magnitude of the voltage at the node exceeds the predetermined voltage by the threshold voltage of the second switching device. More preferably the node is at an overvoltage when the magnitude of the voltage at the node is greater than the predetermined voltage by at least a fixed amount.

Preferably the maximum conductance of the first switching device is greater than the maximum conductance of the second switching device.

Suitably the electronic device is an integrated circuit. Suitably the circuit forms part of the integrated circuit. Suitably the node is a contact of the integrated circuit.

DESCRIPTION OF THE DRAWINGS

The present invention will now be described by way of example with reference to the accompanying drawings, in which.

DETAILED DESCRIPTION OF THE DRAWINGS

The following description is presented to enable any person skilled in the art to make and use the invention, and is provided in the context of a particular application. Various modifications to the disclosed embodiments will be readily apparent to those skilled in the art.

The general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

This invention improves on current ESD clamp designs by providing ESD protection regardless of whether the integrated circuit (or more generally, any kind of electronic device) is powered up or not. The new design removes the need for off chip ESD protection, saving on cost, PCB area, shunt loading and/or series impedance or resistance. Furthermore, the present invention is able to protect high frequency circuits, such as the outputs of radio frequency communication chips.

Figure 1A:
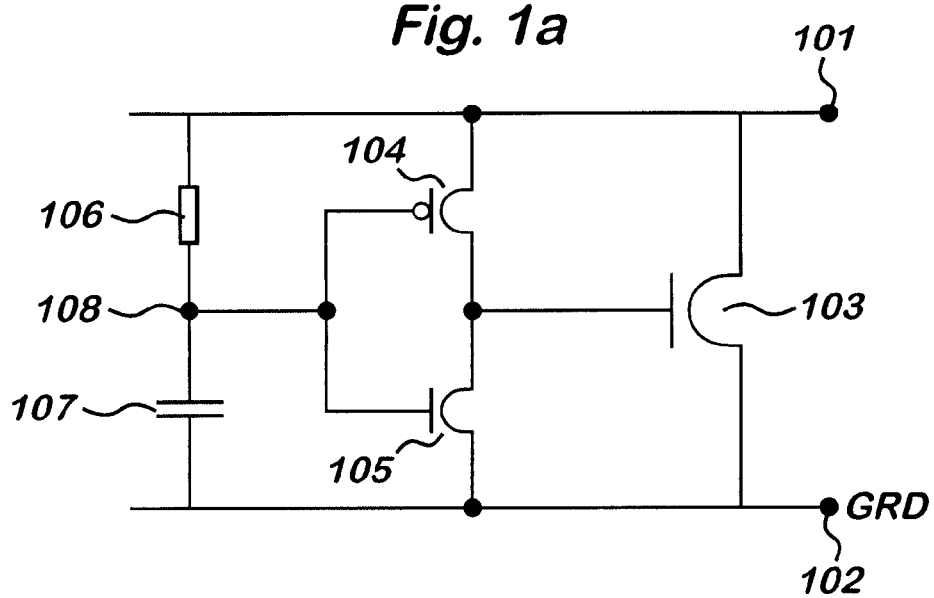
FIG. 1 shows three examples of prior art ESD clamp designs, labelled 1a, 1b and 1c.
Figure 1B:
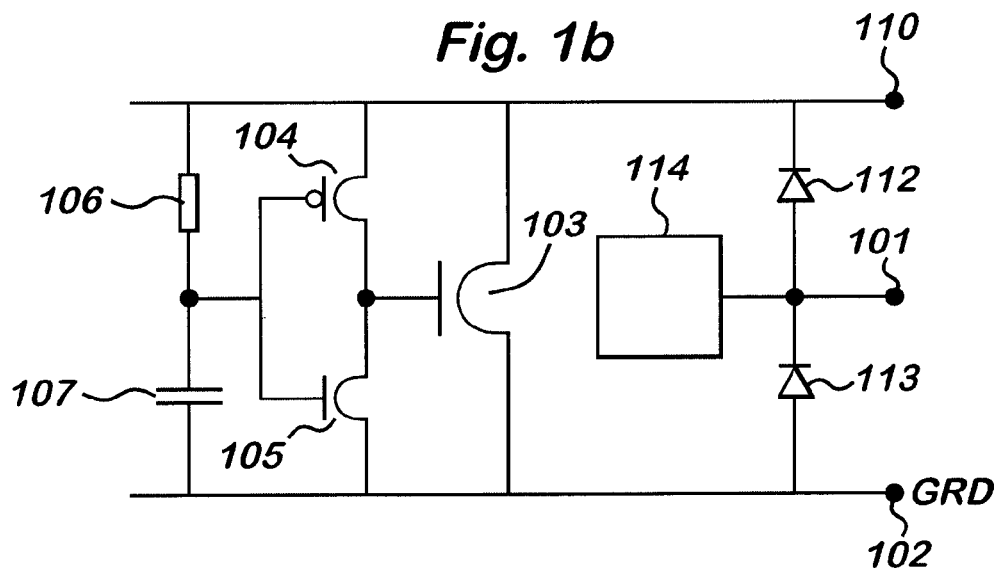
Figure 1C:
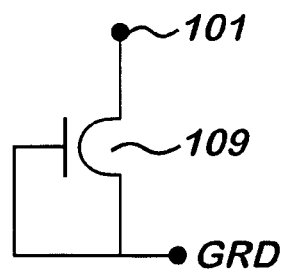
Figure 2:
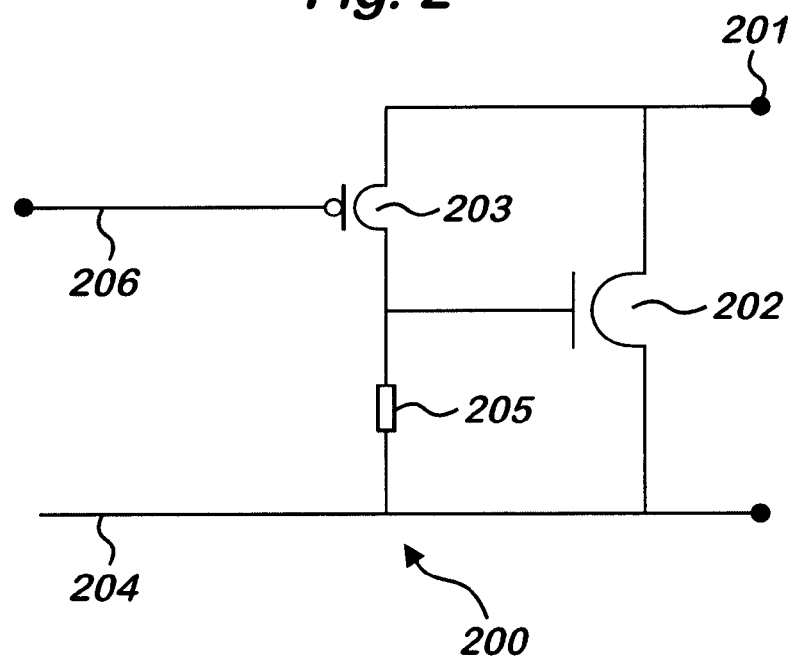
FIG. 2 shows a circuit according to a first embodiment of the present invention.

FIG. 2 shows a circuit 200 configured in accordance with a first embodiment of the present invention to provide protection from ESD events. Large transistor 202 allows the charge associated with an ESD event to flow from node 201 (which is to be protected from ESD events) to ground 204. Node 201 may be an input/output pin of an integrated circuit (IC), or more generally any point in a circuit at which an electrostatic discharge could be damaging.

When an ESD event occurs, the voltage at node 201 increases above the threshold voltage of transistor 203 plus predetermined voltage 206 (which could be a power supply voltage) causing it to switch on and hence pull the gate voltage of large transistor 202 high. This switches on transistor 202 and shorts the charge which has built up at node 201 to ground 204. The threshold voltage of transistor 203 is chosen such that, during normal operation when the circuit to be protected is powered, the voltage at node 201 does not increase beyond predetermined voltage 206 plus the threshold voltage.

The large transistor 202 is preferably an insulated-gate field-effect transistor, such as a MOSFET, but it may be any kind of switching device. In FIG. 2, transistor 202 is shown as an NMOS transistor and transistor 203 as a PMOS transistor. Transistor 202 must be sufficiently large as to be able to safely conduct the ESD charge to ground whilst ensuring that the voltage on node 201 remains below the damage threshold of any device connected to that node. Transistor 203 must be sufficiently large as to be able to pull the gate of transistor 202 sufficiently high in a sufficiently short period of time to protect a device connected to node 201, and to be able to quickly overcome any impedance connected to that node. The circuit further comprises resistor 205 connected between the gate of transistor 202 and ground 204. This resistor ensures that transistor 202 remains off at all other times.

In the embodiments in which node 201 is an input/output pin of an integrated circuit, the arrangement shown in FIG. 2 can protect the circuits connected to node 201 when the pin is not protected by PCB-based (i.e. external to the IC) ESD protection. The present invention is able to protect ICs both during handling when the IC is not connected to any other components and also when the IC is integrated in a larger circuit, whether powered or not. When the IC is integrated in a larger circuit and powered, transistor 202 switches on when the voltage at the pin reaches the intrinsic threshold voltage of transistor 203 plus predetermined voltage 206; when the IC is not powered or is not coupled to any other components, transistor 202 switches on when the voltage at the pin reaches the intrinsic threshold voltage of transistor 203. The present invention is therefore useful for protecting any pin of an integrated circuit which is not protected as a result of the nature of the components connected to that pin.

The ESD clamp shown in FIG. 2 is functional whether the circuit is powered or not and does not require any external components, thus decreasing the cost, size, and complexity of providing an integrated circuit with ESD protection. Furthermore, since no ESD current flows through rail 206, the resistance and decoupling of the supply rail is not critical. For reliable operation, the capacitance to ground 204 on voltage rail 206 must be greater than the gate-source capacitance of transistor 203 or must be controlled despite the disturbance that may be caused by signals injected through the gate-source capacitance of transistor 203. However, it has been found that this capacitance does not need to be expressly provided on-chip and, in practice, the capacitance provided by internal parasitic capacitance and components external to the chip (in particular, the decoupling capacitors of a power supply) will normally be sufficient. The ESD clamp of the present invention therefore uses less die space.

The ESD clamp presents a low capacitance at point 201 as compared to conventional clamps and it is therefore suitable for use in circuits operating to at least VHF frequencies. Furthermore, the size of the switching devices in the clamp can be easily scaled to give very high specification ESD protection, tailored to the requirements and operating environment of the circuit to be protected.

Figure 3:
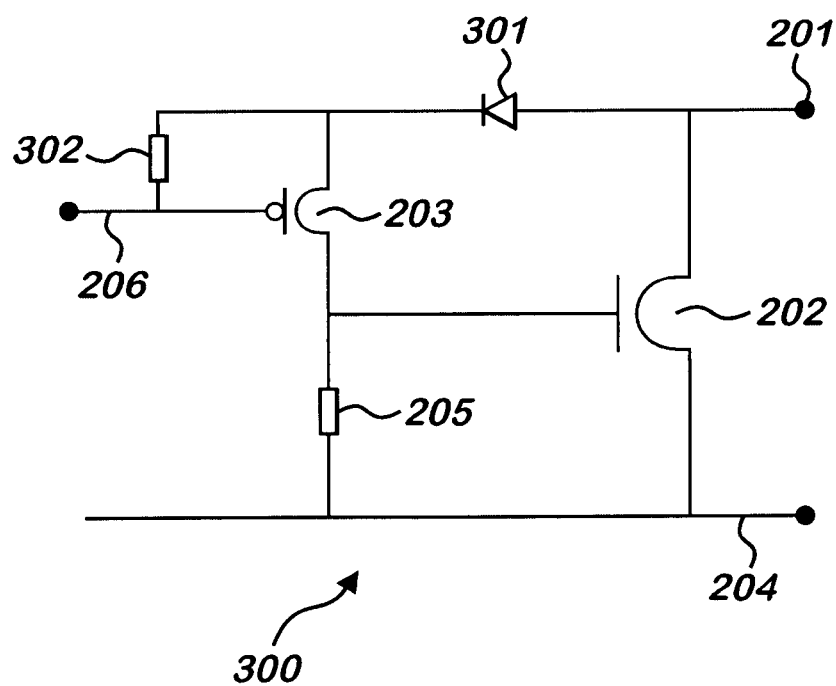
FIG. 3 shows a circuit according to a second embodiment of the present invention.

A second embodiment 300 of the present invention is shown in FIG. 3. Transistor 203 is coupled to node 201 by means of a small diode 301, as shown in FIG. 3. Diode 301 acts to reduce parasitic capacitive loading at the node and to increase the voltage at which the circuit starts to conduct by approximately 300 mV-700 mV per diode inserted. The diode only needs to be able to conduct a few mA because the ESD current does not pass through the diode. Furthermore, component 301 increases the trigger voltage of the clamp circuit without affecting the clamp's ability to conduct ESD current. Alternatively, a network of active or passive components could be used in place of the diode shown in FIG. 3.

Preferably, a circuit in accordance with the second embodiment of the present invention includes resistor 302 between diode 301 and the gate of transistor 203 to provide a path to leak away any charge that is pumped through the diode by occasional transient glitches at 201.

An ESD clamp in accordance with the second embodiment of the present invention is particularly useful for protecting a node 201 at which the voltage may increase significantly above the predetermined voltage on rail 206—for example, a pin driving an inductive load.

Figure 4:
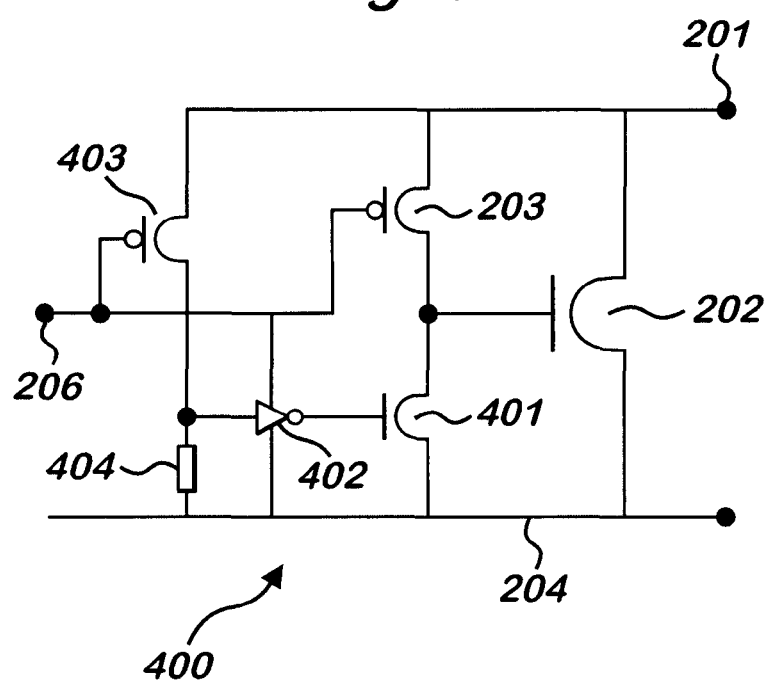
FIG. 4 shows a circuit according to a third embodiment of the present invention.

FIG. 4 shows a third embodiment of the present invention. The third embodiment 400 of the present invention uses a second clamp to hold the gate of transistor 202 low when the chip is powered. This helps to reduce the leakage current through transistor 202 and minimise the interaction of the ESD protection circuit with the signal at node 201. The trigger voltage of transistor 403 is chosen to be similar to the trigger voltage of transistor 203.

Pull-down transistor 401 replaces passive resistor 205 of the circuit shown in FIGS. 2 and 3 and provides a stronger pull-down than resistor 205. It is most straightforward to arrange transistors 203 and 401 to have opposite polarity. In FIG. 4, switching device 203 is a PMOS transistor and switching device 401 is an NMOS transistor. The gate of transistor 401 is connected to the output of inverter 402, which takes its input from the potential divider formed by transistor 403 and resistor 404 and arranged between node 201 and ground 204. The gate of transistor 403 is connected to predetermined voltage 206.

When an ESD event occurs at node 201, transistors 403 switches on in the same manner as described above for transistor 203. The output of the potential divider formed by transistor 403 and resistor 404 is therefore tied to node 201 and goes high, causing the output of inverter 402 to go low. Transistor 401 is therefore turned off ensuring that the gate of transistor 202 is allowed to go high, switching transistor 202 fully on. This behaviour is consistent whether the circuit is powered or not (i.e. whether or not there is a voltage at rail 206) and, because all the components can readily be integrated into a chip, the circuit is suitable for protecting a chip from ESD events irrespective of whether the chip is integrated in to a larger circuit.

In FIG. 4, inverter 402 is shown as being powered from voltage rail 206. However, the inverter could alternatively be powered from node 201, or from both voltage rail 206 and node 201 for an inverter having two parallel pull-up PMOS devices (one having its source connected to 201 and the other having its source connected to the supply rail).

The particular advantage afforded by components 401 to 404 in FIG. 4 is that, when the circuit is powered and operating normally (i.e. an ESD event has not occurred), the gate of transistor 202 is strongly held low so as to minimise the leakage current through the transistor. Thus transistor 202 is prevented from partially triggering due to transient voltage fluctuations at node 201 which may be coupled to the gate of transistor 202. Furthermore, pull down device 401 is necessarily always off when the circuit is not powered so clamp device 202 is not prevented from turning on when an ESD event occurs.

A fourth—and the preferred—embodiment of the present invention will be apparent from a combination of the clamp circuits shown in FIGS. 3 and 4. Diode 301 and resistor 302 may be incorporated into the circuit shown in FIG. 4 so as to increase the trigger voltage, as described in relation to FIG. 3 above. This preferred embodiment is suitable for providing on-chip protection for pins which drive loads that exceed the power supply voltage by a known margin, and the low capacitance presented at node 201 allows the circuit to protect pins carrying a high frequency. As with the other embodiments, the size of the devices making up the clamp circuit can be scaled so as to match the performance of the ESD clamp to that required for the application.

When the voltage at node 201 exceeds the arbitrary voltage on rail 206 by a sufficient and configurable margin, the node may be said to be at an "overvoltage". However, for the purposes of the present invention, node 201 is at an overvoltage when the voltage at the node is sufficient to trigger transistor 203. The particular voltage at which this occurs may be chosen by selecting transistors having appropriate intrinsic threshold voltages and through appropriate circuit design. For example, the trigger voltage of transistor 203 may be determined through the use of a resistor or resistor and capacitor voltage-dividing network. The second embodiment of the present invention, shown in FIG. 3, demonstrates a preferred technique for setting the trigger voltage.

For certain types of chip, it may be desirable for the overvoltage to occur at a particular margin above the predetermined voltage on rail 206 (for example, at a margin of 1, 2, or 3 V) so as to ensure that the ESD clamping mechanism is not accidentally triggered by minor voltage spikes or fluctuations at node 201.

It is important that the overvoltage at which transistor 203 is configured to trigger is greater in magnitude than the operating voltage range (the "operating range") of the chip, device or node the clamping circuit is arranged to protect. The operating range is the range of voltages which are achievable at node 201 under normal operation of the chip/device/circuit. For some chips this voltage range can be larger than the supply voltage. For the purposes of the present invention, it is the magnitude of the voltage at node 201 which essentially determines when transistor 203 triggers. Circuits configured in accordance with the present invention are operable to protect node 201 from ESD events of either polarity.

Because the present invention can provide on-chip ESD protection, an ancillary advantage of this invention is that, for any pins of the chip that are protected by the present invention, ESD protection can be removed from the PCB configured to protect the chip. This reduces the cost, PCB size and parasitic circuit loading caused by the discrete components of a conventional ESD clamp.

This invention is particularly useful for protecting the output pins of frequency modulated (FM) radio chips which have a direct DC path to an FM antenna. FM antennas are, by definition, large and therefore more likely to be exposed to electrostatic events. The present invention can also be used on the output pins of Bluetooth, UWB Bluetooth and IEEE 802.11 chips which generate signals which range between 2 and 9 GHz.

The present invention is capable of providing ESD protection to the level of the IEC EN61000-4-2 specification: electrostatic voltages exceeding 15 KV and currents of more than 24 A. This level of protection cannot be achieved with conventional off-chip ESD clamps without degrading the performance of high frequency circuits to unacceptable levels.

The exemplary embodiments of the present invention have been described as using transistors in order to control the flow of charge from node 201 to ground. However, the transistors could be any kind of switching devices configured in accordance with the present invention. The term "gate" as used herein in relation to field effect transistors should be understood to refer to the appropriate control element of the switching device. For example, the terms "gate", "source" and "drain" conventionally refer to the contacts of a field effect transistor; for the general class of bipolar transistors, these elements may be referred to as the "base", "collector" and "emitter".

Although the present invention has been described in relation to circuits having a "ground" rail, it should be understood that the term "ground" as used herein and in the claims may refer to a lower or higher voltage supply rail, an earth, or any suitable current path via which an electrostatic charge may flow without damaging ESD-sensitive devices—for example a casing in which the circuit is housed.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

The invention claimed is:

1. A circuit for protecting a node in an electronic device from an electrostatic discharge comprising:
    a voltage rail arranged to provide a predetermined voltage when the device is powered;
    a first switching device connected between said node and ground;
    a second switching device connected between the node and the gate or base of the first switching device and arranged to control the conductance of the first switching device between said node and ground, the gate or base of the second switching device being coupled to the voltage rail;
    a third switching device connected between the base or gate of the first switching device and ground;
    a fourth switching device and a resistor connected in series between the node and ground so as to form a potential divider, the fourth switching device having its base or gate connected to the voltage rail;
    a voltage inverter receiving as its input the output of the potential divider and providing its output at the base or gate of the third switching device;
    wherein, the second switching device is configured to, irrespective of whether the device is powered or not powered, (a) hold the conductance of the first switching device low when the potential difference between the node and the voltage rail is within an operating range, and (b) hold the conductance of the first switching device high in response to an overvoltage at the node so as to allow current to flow from the node to ground, and the third switching device is configured to, when the device is powered, hold the conductance of the first switching device low when the potential difference between the node and the voltage rail is within the operating range, and, when the device is not powered, hold the conductance of the first switching device high in response to an overvoltage at the node.

2. A circuit as claimed in claim 1, wherein the first and second switching devices are transistors of opposite polarity.

3. A circuit as claimed in claim 1, wherein the drain or collector of the second switching device is coupled to ground by means of a resistor so as to reduce the gate or base voltage of the first device therefore reducing the leakage current through the first switching device.

4. A circuit as claimed in claim 1, wherein the second switching device is coupled to the node by means of a diode in such a way as to increase the voltage level at the node which causes the second switching device to switch.

5. A circuit as claimed in claim 4, wherein the base or gate of the second switching device is coupled to the diode by a resistor so as to reduce the sensitivity of the second switching device to voltage fluctuations at the node.

6. A circuit as claimed in claim 1, wherein the second and third switching devices are transistors of opposite polarity.

7. A circuit as claimed in claim 1, wherein the operating range is approximately equal to the threshold voltage of the second switching device.

8. A circuit as claimed in claim 4, wherein the operating range is at least partly determined by said diode.

9. A circuit as claimed in claim 1, wherein the node is at an overvoltage when the magnitude of the voltage at the node exceeds the predetermined voltage by the threshold voltage of the second switching device.

10. A circuit as claimed in claim 1, wherein the node is at an overvoltage when the magnitude of the voltage at the node is greater than the predetermined voltage by at least a fixed amount.

11. A circuit as claimed in claim 1, wherein the maximum conductance of the first switching device is greater than the maximum conductance of the second switching device.

12. A circuit as claimed in claim 1, wherein the third and fourth switching devices are transistors of opposite polarity.

13. A circuit as claimed in claim 1, wherein the electronic device is an integrated circuit.

14. A circuit as claimed in claim 1, wherein the circuit forms part of the integrated circuit.

15. A circuit as claimed in claim 1, wherein the node is a contact of the integrated circuit.

\* \* \* \* \*